(12) United States Patent
Hata et al.

(10) Patent No.: US 7,256,085 B2
(45) Date of Patent: Aug. 14, 2007

(54) SEMICONDUCTOR MEMORY DEVICE AND MANUFACTURING METHOD THEREOF

(75) Inventors: Kazuhiro Hata, Fukuyama (JP); Shinichi Sato, Fukuyama (JP); Yukiharu Akiyama, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 334 days.

(21) Appl. No.: 11/077,233

(22) Filed: Mar. 11, 2005

(65) Prior Publication Data
US 2005/0199946 A1      Sep. 15, 2005

(30) Foreign Application Priority Data
Mar. 12, 2004   (JP)   ............................ 2004-071081

(51) Int. Cl.
*H01L 21/8238*    (2006.01)
(52) U.S. Cl. ...................... 438/201; 438/211; 438/257; 438/573; 257/E21.422
(58) Field of Classification Search ................ 438/201, 438/211, 257, 573; 257/E21.422
See application file for complete search history.

(56) References Cited

U.S. PATENT DOCUMENTS 6,917,069 B2 *   7/2005   Kianian et al. .............. 257/315

2002/0034846 A1 *   3/2002   Wang ........................ 438/200
2003/0141539 A1 *   7/2003   Chern ........................ 257/316

FOREIGN PATENT DOCUMENTS

JP      2000-216270      8/2000

* cited by examiner

*Primary Examiner*—Matthew Smith
*Assistant Examiner*—Thanh V. Pham
(74) *Attorney, Agent, or Firm*—Nixon & Vanderhye, P.C.

(57) ABSTRACT

A manufacturing method of a semiconductor memory device comprising the steps of: forming plural trenches in stripes in a semiconductor substrate and filling each of the trenches with an element isolation insulating film to form element isolation regions; sequentially forming a tunnel insulating film and a charge-storable film so as to cover active regions between the element isolation regions; forming an interlayer insulating film on the charge-storable film; forming plural control gates on the interlayer insulating film in a direction orthogonal to a longitudinal direction of the trenches; among source formation regions and drain formation regions alternately provided between the plural control gates, etching the element isolation insulating film in the source formation regions, using as a mask a resist film having openings in the source formation regions, to expose surfaces of the trenches; and carrying out isotropic plasma ion implantation on the source formation regions to form source diffusion layers in the surfaces of the trenches and in the active regions.

7 Claims, 14 Drawing Sheets

Fig. 17(a)    Fig. 17(b)
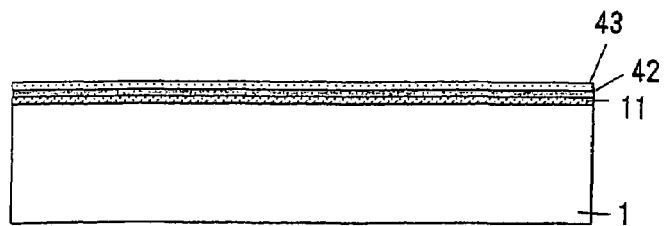 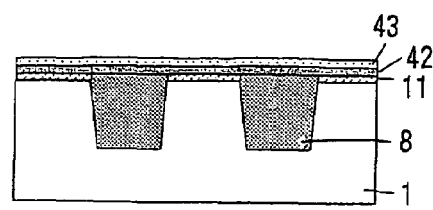
Fig. 18(a)    Fig. 18(b)
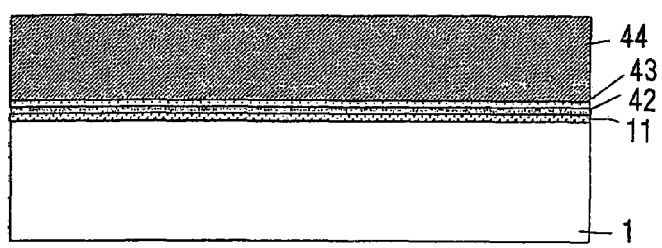 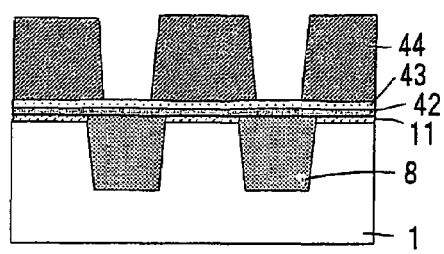
Fig. 19(a)    Fig. 19(b)
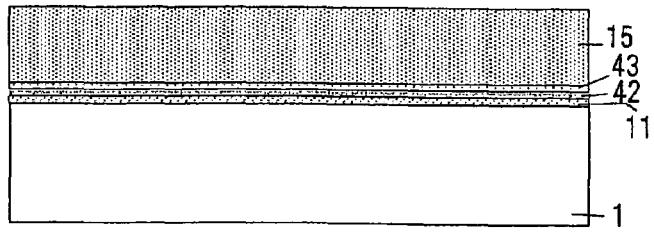 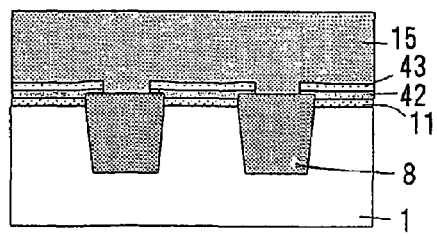
Fig. 20(a)    Fig. 20(b)
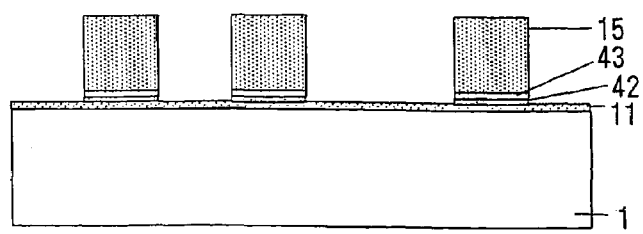 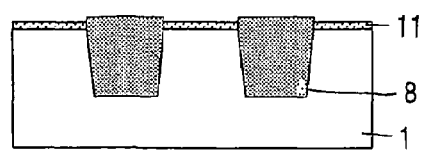

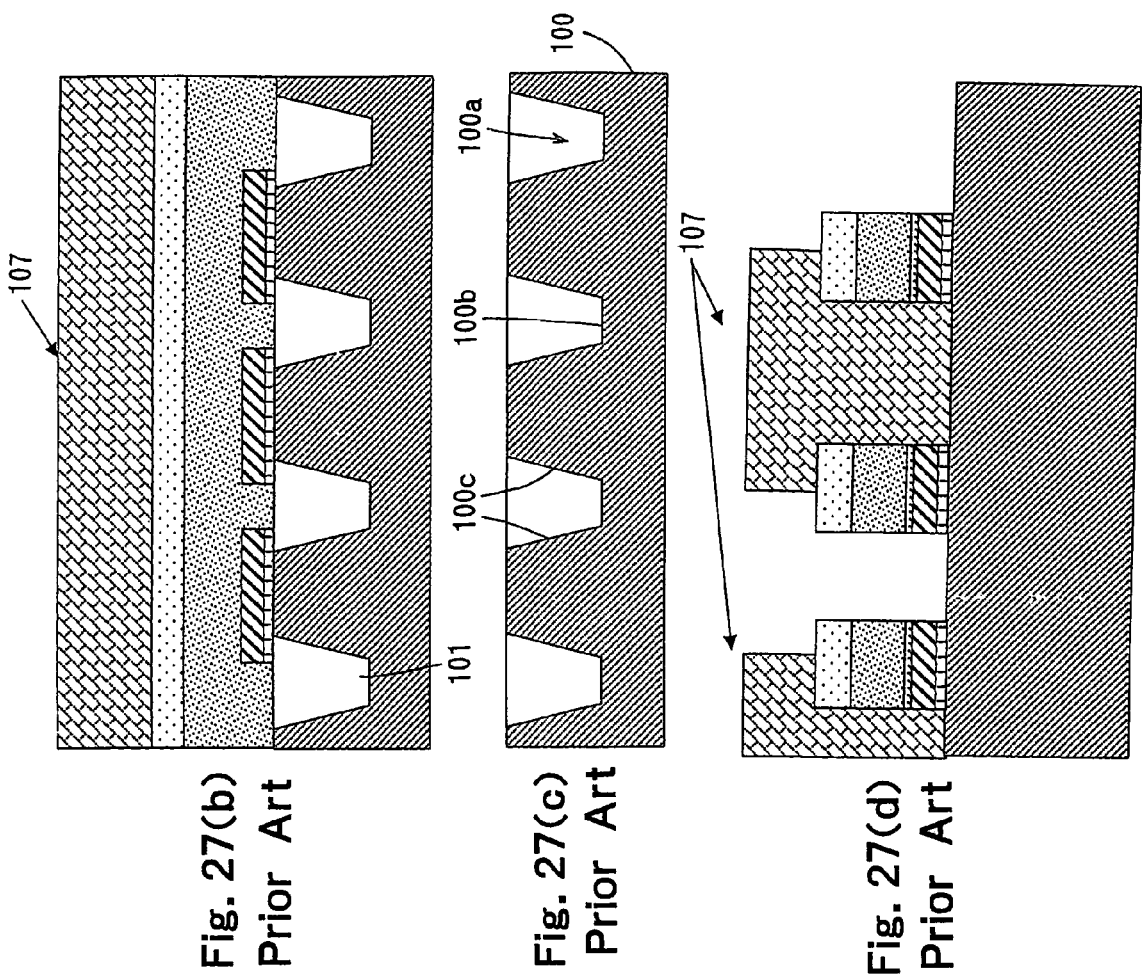
Fig. 27(b) Prior Art
Fig. 27(c) Prior Art
Fig. 27(d) Prior Art
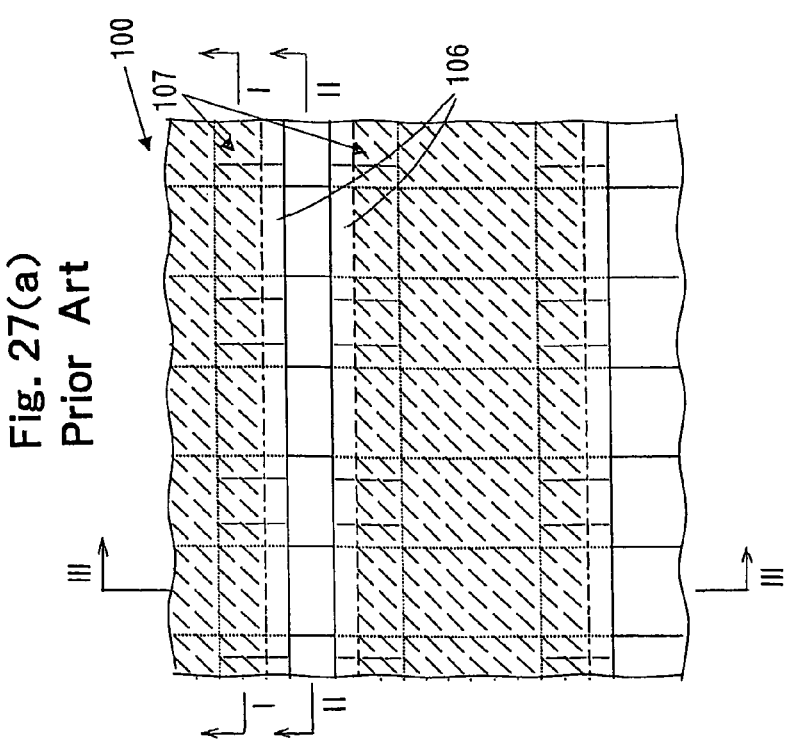
Fig. 27(a) Prior Art

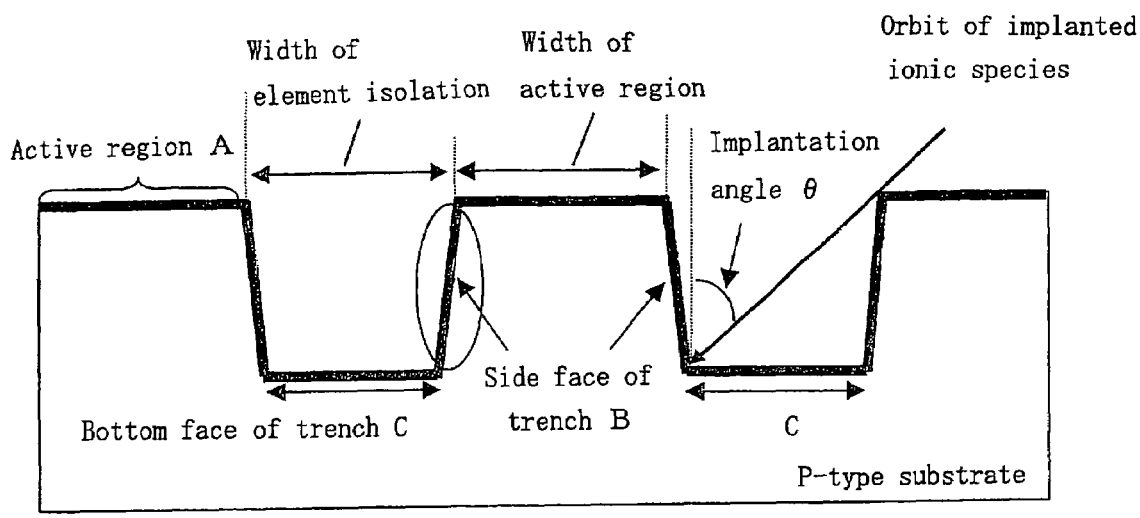
Fig. 30
Prior Art
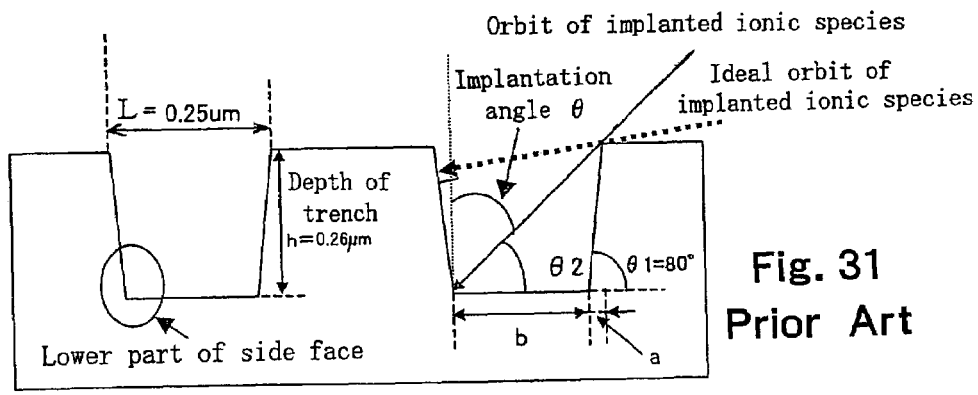
Fig. 31
Prior Art
Fig. 32
Prior Art
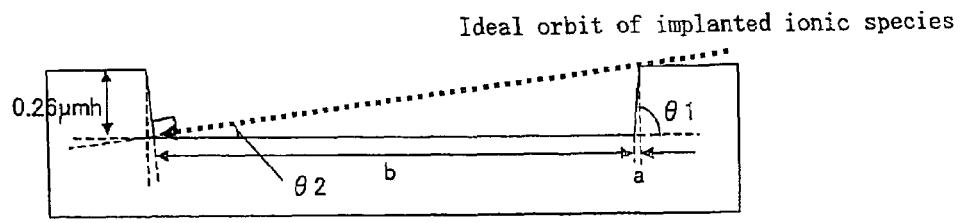

SEMICONDUCTOR MEMORY DEVICE AND MANUFACTURING METHOD THEREOF

CROSS-REFERENCE TO RELATED APPLICATION

This application is related to Japanese applications No. 2004-071081, filed on 12 Mar., 2004 whose priority is claimed under 35 USC § 119, the disclosure of which is incorporated by reference in its entirety.

BACKGROUND OF THE INVENTION (1) Field of the Invention

The present invention relates to a semiconductor memory device and a manufacturing method thereof. More specifically, the present invention relates to a semiconductor nonvolatile memory device having a floating gate (charge storing layer) and a control gate where a source region has a low resistance or a semiconductor nonvolatile memory device having a structure (tunnel insulating film/$Si_3N_4$ film or $Al_2O_3$ film/oxide film/control gate film) where an $Si_3N_4$ layer or an $Al_2O_3$ layer is used to store charges instead of the floating gate, and a manufacturing method thereof.

(2) Description of the Related Art

For example, JP-A 2000-216270 discloses a structure of and a manufacturing method of a conventional semiconductor nonvolatile memory device (flash memory). This semiconductor nonvolatile memory device will be described with reference to FIGS. 24 to 29. First, with reference to FIGS. 24(a) to 24(d), trenches are formed in stripes in a surface of a silicon substrate 100 by means of reactive etching. Each trench is filled with an element isolation insulating film 101 made of $SiO_2$ to provide active regions (diffusion layer regions) 102 between respective element isolation insulating films 101. Herein, FIGS. 24(a) to 24(d) illustrate a first step of the manufacturing method of the conventional semiconductor nonvolatile memory device. FIG. 24(a) is a partial plan view, FIG. 24(b) is a cross-sectional view taken along line I-I of FIG. 24(a), FIG. 24(c) is a cross-sectional view taken along line II-II of FIG. 24(a), and FIG. 24(d) is a cross-sectional view taken along line III-III of FIG. 24(a).

Next, with reference to FIGS. 25(a) to 25(d), a gate oxide film 103 made of $SiO_2$ and a floating gate film (hereinafter, referred to as "FG electrode") 104 made of polysilicon are sequentially layered on the entire surface of the silicon substrate 100. A resist film (not shown) is formed thereon using a photolithographic method so as to cover the active regions 102. The gate oxide film 103 and the FG electrode 104 are patterned in stripes by means of etching using the resist film as a mask. Herein, FIGS. 25(a) to 25(d) illustrate a second step of the manufacturing method of the conventional semiconductor nonvolatile memory device. FIG. 25(a) is a partial plan view, FIG. 25(b) is a cross-sectional view taken along line I-I of FIG. 25(a), FIG. 25(c) is a cross-sectional view taken along line II-II of FIG. 25(a), and FIG. 25(d) is a cross-sectional view taken along line III-III of FIG. 25(a).

Next, with reference to FIGS. 26(a) to 26(d), an interlayer insulating film (so-called ONO film) 105 including a silicon oxide film, a silicon nitride film and a silicon oxide film is formed to cover the FG electrode 104. Next, plural control gates (hereinafter, referred to as CG wires) 106 are formed on the upper surface of the silicon substrate 100 in a direction orthogonal to a longitudinal direction of the element isolation insulating films 101. Each CG wire 106 is formed of a layered film including a lower layered poly-crystal silicon film 106a and an upper layered WSi film 106b. Herein, FIGS. 26(a) to 26(d) illustrate a third step of the manufacturing method of the conventional semiconductor nonvolatile memory device. FIG. 26(a) is a partial plan view, FIG. 26(b) is a cross-sectional view taken along line I-I of FIG. 26(a), FIG. 26(c) is a cross-sectional view taken along line II-II of FIG. 26(a), and FIG. 26(d) is a cross-sectional view taken along line III-III of FIG. 26(a).

Next, with reference to FIGS. 27(a) to 27(d), a resist pattern 107 having openings in source formation regions between the CG wires 106 is formed. Thereafter, this resist pattern 107 (hatched portions in FIG. 27(a)) and the CG wires 106 are used as a mask to etch the element isolation insulating films 101, thereby exposing the surfaces of the trenches 100a (bottom face 10b and both side faces 100c, 100c), i.e., the surface of the silicon substrate 100. Herein, FIGS. 27(a) to 27(d) illustrate a fourth step of the manufacturing method of the conventional semiconductor nonvolatile memory device. FIG. 27(a) is a partial plan view, FIG. 27(b) is a cross-sectional view taken along line I-I of FIG. 27(a), FIG. 27(c) is a cross-sectional view taken along line II-II of FIG. 27(a), and FIG. 27(d) is a cross-sectional view taken along line III-III of FIG. 27(a).

Next, with reference to FIGS. 28(a) to 28(d), arsenic ions are implanted as impurities in a direction perpendicular to the plane of the silicon substrate 100, and source diffusion layers 108 are formed in the regions between the respective trenches 100a (active regions 102) and at the bottom face 100b of the respective trenches 100a in the exposed source formation regions. Next, after the resist pattern 107 is removed, arsenic ions are implanted into the entire surface of the silicon substrate 100 using the CG wires 106 as a mask so as to form the source diffusion layers 108 and drain diffusion layers 109. Herein, FIGS. 28(a) to 28(d) illustrate a fifth step of the manufacturing method of the conventional semiconductor nonvolatile memory device. FIG. 28(a) is partial a plan view, FIG. 28(b) is a cross-sectional view taken along line I-I of FIG. 28(a), FIG. 28(c) is a cross-sectional view taken along line II-II of FIG. 28(a), and FIG. 28(d) is a cross-sectional view taken along line III-III of FIG. 28(a). In addition, plural arrow marks indicate ion implantation in FIGS. 28(c) and 28(d).

Next, with reference to FIGS. 29(a) to 29(d), an insulating film such as a silicon oxide film is made to grow on the entire surface of the silicon substrate 100 and etching back is carried out, so that sidewall insulating films 110 are formed on both side faces of the respective layered bodies including the CG wires 106, the interlayer insulating films 105, the FG electrodes 104 and the gate oxide films 103. Next, the silicon substrate 100 on a turn table is rotated, and a rotation oblique ion implantation of arsenic ions is carried out on the entire surface of the silicon substrate 100. Arsenic ions are implanted into the both side faces 100c, 100c of the trenches 100a so as to form the source diffusion layers 108. As a result, ion implantation for the surfaces of the active regions 102, the bottom face 100 and both side faces 100c, 100c of the trenches 100a are completed, thereby achieving reduction in resistance of the source regions. Thereafter, a wire isolation film (not shown) is formed on the entire surface of the silicon substrate 100 according to the known art, and this wire isolation film is pattered so as to form contact portions (not shown) in the source diffusion layers 108 and drain diffusion layers 109 in such a manner that pairs of two FG electrodes 104 on both sides of each source diffusion layer 108 are divided from each other. Next, a metal wire film (not shown) is deposited according to a sputtering method, and this metal wire film is patterned in a photolithographic step and in a etching step to obtain a flash memory. Herein, FIGS. 29(a) to 29(d) illustrate a sixth step of the manufacturing method of the conventional semiconductor nonvolatile memory device. FIG. 29(a) is a partial plan view, FIG. 29(b) is a cross-sectional view taken along line I-I of FIG. 29(a), FIG. 29(c) is a cross-sectional view taken along line II-II of FIG. 29(a), and FIG. 29(d) is a cross-sectional view taken along line III-III of FIG. 29(a). In addition, plural arrow marks indicate the diagonal ion implantation through rotation in FIGS. 29(c) and 29(d).

In the step (see FIG. 27(c)) described with reference to FIG. 27, however, the element isolation insulating films in the source formation regions are removed from the silicon substrate 100 so that the surfaces of the trenches 100a are exposed. Consequently, steps are formed in the surface of the silicon substrate 100. Therefore, as shown in FIG. 29, in the conventional method for forming diffusion layers by using a method for rotation oblique ion implantation, when memory cells are miniaturized, an implantation angle θ at which ions can be implanted into the side faces of the trenches B is limited due to shadowing effects as shown in FIG. 30, and the resistance in the diffusion layer that is equivalent to that of the active region surfaces A cannot be secured even in the case where rotation oblique ion implantation carried out on the side faces B. As a result, it is difficult to lower the resistance in the source regions to 5000Ω or less (standard of a source resistance value that does not cause a problem in the speed of operation). Consequently, a problem arises where deterioration is caused in the operation of cells in the flash memory as a device, specifically, in a writing speed and in a reading speed.

As shown in FIG. 31, an implantation angle θ that is required to implant ionic species into a lower part of the side faces of the trenches cannot be made to be about 39° or more due to the shadowing effects caused by a structure of the trench where, for example, a width L of the element isolation between memory cells is 0.25 μm, a depth h of the trench is 0.26 μm and a taper angle θ1 is 80°. In the case where ions are implanted at an implantation angle θ of 39°, a resistance in the diffusion layer becomes about 10000Ω, which is a high diffusion resistance. It is necessary to implant the same amount of ions as those in the active region surfaces A and the bottom faces of the trenches C (see FIG. 30) in the side faces of the trenches B, in order to lower the diffusion resistance. It is therefore necessary to implant ions approximately perpendicularly to the side faces of the trenches B. In FIG. 31, an orbit of implanted ionic species (at an implantation angle of 39°) is indicated by a solid line arrow mark, and an ideal orbit for implanted ionic species (at an implantation angle of 80°) is indicated by a dotted line arrow mark.

Also in FIG. 31, "a" indicates a gradient length in the side face of the trench having a taper angle θ1, "b" indicates a width of the bottom face of the trench, and "θ2" indicates an angle formed between an orbit of implanted ionic species and the bottom face of the trench.

The above-mentioned "a", "b" and "θ2" can be found by the following equations:

$a = h/\tan\theta1$, $a+b = h/\tan\theta2$, and $\theta2 = \tan^{-1}(h/(L-(a+b)))$ or $90°-\theta$.

In the case of a semiconductor substrate having the structure shown in FIG. 31, "a"=0.046 μm, "θ2"=51° and "b"=0.206 μm according to the above-mentioned equations.

However, the width b of the bottom face of the trench must be 1.43 μm or more, which is not desirable for memory cell miniaturization, in a trench where the depth h of the trench is 0.26 μm and the taper angle θ1 is 80°, as shown in FIG. 32, in order to implant ions in the ideal orbit of implanted ions (implantation angle is 80°). Therefore, another technique is considered, where the depth of the trench is decreased so as to be 0.2 μm or less, and the resistance in the diffusion layer in the side faces of the trench B which is the source region is lowered in order to lower the resistance in the diffusion layer and miniaturize the memory cell. In the case where the depth of the trench is reduced so as to be 0.2 μm or less, however, withstand voltage of the element isolation in a peripheral transistor portion is not sufficient (0.2 μm or more is necessary). Therefore, it becomes necessary to prepare trenches with different depths within memory cells and in the peripheral transistor portion, which increases the number of steps in the process, adding, for example, a photolithographic step of forming a mask, and a new problem arises where the cost of the process increases.

SUMMARY OF THE INVENTION

In order to solve the above-mentioned problems of the conventional art, an object of the present invention is to provide a semiconductor memory device capable of forming a source resistance having no problem in operation of an LSI even when memory cells are miniaturized, and a manufacturing method thereof.

According to one aspect of the present invention, there is provided a manufacturing method of a semiconductor memory device comprising the steps of: forming plural trenches in stripes in a semiconductor substrate and filling each of the trenches with an element isolation insulating film to form element isolation regions; sequentially forming a tunnel insulating film and a charge-storable film so as to cover active regions between the element isolation regions; forming an interlayer insulating film on the charge-storable film; forming plural control gates on the interlayer insulating film in a direction orthogonal to a longitudinal direction of the trenches; among source formation regions and drain formation regions alternately provided between the plural control gates, etching the element isolation insulating film in the source formation regions, using as a mask a resist film having openings in the source formation regions, to expose surfaces of the trenches; and carrying out isotropic plasma ion implantation on the source formation regions to form source diffusion layers in the surfaces of the trenches and in the active regions.

According to another aspect of the present invention, there is provided a semiconductor memory device comprising: element isolation regions in which plural trenches formed in stripes in a semiconductor substrate are partially filled with an element isolation insulating film; a tunnel insulating film, a charge-storable film and an interlayer insulating film which are sequentially formed so as to partially cover active regions between the element isolation regions; and plural control gates formed on the interlayer insulating film in a direction orthogonal to a longitudinal direction of the trenches, wherein among source formation regions and drain formation regions alternately provided between the plural control gates, the source formation regions each composed of side faces and a bottom face of the trench and the active regions serve as source diffusion layers having a uniform impurity concentration.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIGS. 17 to 23 are cross-sectional views sequentially showing ninth to fifteenth steps of the manufacturing method of a memory cell portion of a semiconductor memory device according to a second embodiment of the present invention FIGS. 24 to 29 are plan and cross-sectional views sequentially showing first to sixth steps of a manufacturing method of the memory cell portion of the semiconductor memory device of a prior art.

FIG. 30 is a cross-sectional view showing a conventional method for manufacturing a source formation region of a conventional semiconductor device.

FIG. 31 is a first pattern diagrams showing an implantation angle by means of a conventional ion implantation technique.

FIG. 32 is a second pattern diagrams showing an implantation angle by means of a conventional ion implantation technique.

DESCRIPTION OF THE PREFERRED EMBODIMENTS

Figure 1:
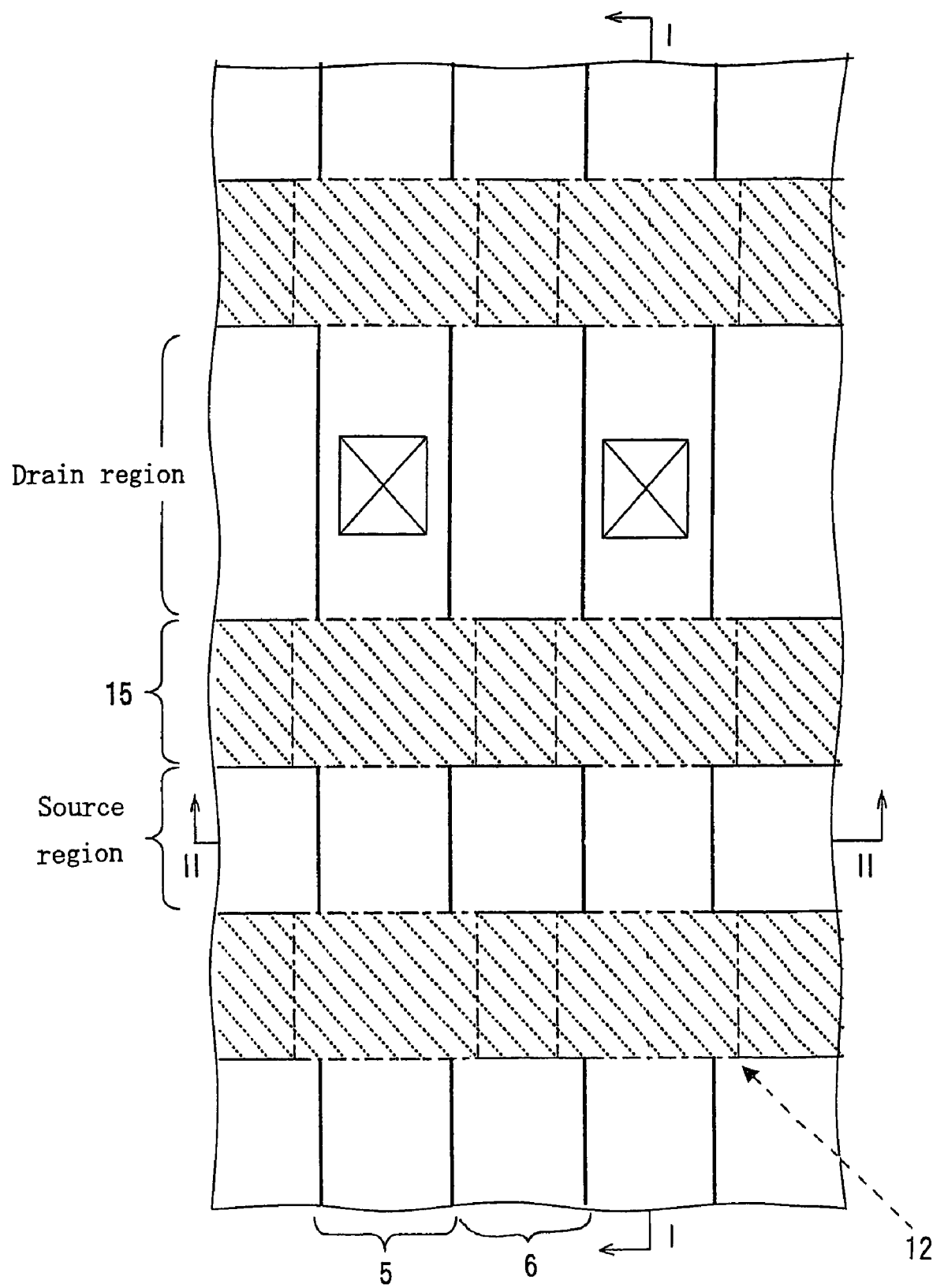
FIG. 1 is a plan view showing a memory cell portion of a semiconductor memory device according to a first embodiment of the present invention.

In accordance with the manufacturing method of the semiconductor memory device according to the present invention, source diffusion layers having a uniform impurity concentration in the active regions and the side faces and bottom faces of the trenches of the source formation regions can be formed by means of isotropic plasma ion implantation. Therefore, reduction in the resistance of the source regions can be achieved easily and without fail, and miniaturization of memory cells which cause no problems in operation of an LSI can be achieved.

According to the conventional ion implantation technique (rotation oblique ion implantation technique), only implantation in one direction at a predetermined angle is possible; therefore, the depth of the trenches of the memory cells, the angle of the side faces of the trenches, the width of the element isolation and the like are restricted. More specifically, as described with reference to FIGS. 30 to 32, the resistance in the diffusion layers cannot be lowered to 5000 Ω, unless the depth of the trenches is 0.2 μm or less, the angle (θ1) is 80° or less, and the width of the element isolation is 0.25 μm or more. According to the present invention, the implanted ionic species can be uniformly diffused in the implantation regions, and the ionic species can be isotropically implanted in many directions. Accordingly, ion implantation can be uniformly carried out on the active regions and the side faces and bottom faces of the trenches. As described above, the same level of resistance in the diffusion layers as that in the active regions can be secured in the side faces of the trenches, making the resistance in the source regions to be 5000Ω or less, even in the case where the memory cells are reduced in size. In addition, it is not necessary to make the trenches as shallow as those of which the depth is 0.2 μm or less; therefore, it is not necessary to provide trenches having different depths in the memory cells and in the peripheral transistor portion. Thus, an increase in the number of process steps, such as the addition of a photolithographic step for mask formation, can be prevented.

In addition, the semiconductor memory device according to the present invention, source diffusion layers include the uniform impurity concentration in the active regions and the side faces and bottom faces of the trenches in the source formation regions; therefore, a reduction in resistance of the source regions can be achieved, and miniaturized memory cells can be obtained which cause no problems in operation of an LSI.

The manufacturing method of a semiconductor memory device according to the present invention is characterized in that isotropic plasma ion implantation is carried out on at least source regions in the surface of a semiconductor substrate having step portions so that impurity diffusion layers having a uniform impurity concentration are formed in flat surfaces and the step portions of the substrate. In the semiconductor memory device of the present invention, a $Si_3N_4$ layer or an $Al_2O_3$ layer may be used as a floating gate (charge-storing layer) in a memory cell in addition to a polysilicon layer typically used for a flash memory, for example.

The manufacturing method of a semiconductor memory device according to the present invention comprising the steps of:

(1) forming plural trenches in stripes in a semiconductor substrate and filling each of the trenches with an element isolation insulating film to form element isolation regions;

(2) sequentially forming a tunnel insulating film and a charge-storable film so as to cover active regions between the element isolation regions;

(3) forming an interlayer insulating film on the charge-storable film;

(4) forming plural control gates on the interlayer insulating film in a direction orthogonal to a longitudinal direction of the trenches;

(5) among source formation regions and drain formation regions alternately provided between the plural control gates, etching the element isolation insulating film in the source formation regions, using as a mask a resist film having openings in the source formation regions, to expose surfaces of the trenches; and (6) carrying out isotropic plasma ion implantation on the source formation regions to form source diffusion layers in the surfaces of the trenches and in the active regions.

In the step (1), the semiconductor substrate is not particularly limited, but rather, an SOI substrate having a silicon film as an upper layer can be used, in addition to semiconductor substrates which are conventionally known in the art, such as single crystal, polycrystal and amorphous silicon substrates as well as a germanium substrate.

As for the method for forming trenches in a semiconductor substrate, conventionally known methods such as dry etching and wet etching can be used, preferably dry etching. At this time, the forms and the dimensions of the trenches are not particularly limited, but rather, for example, trenches of which the cross-section is a trapezoid where the width at the top of the trench is greater than the width of the bottom face, the ratio of the depth of the trench to the width at the top of the trench of 0.3 to 2 and the side face tapered with respect to the bottom face at an angle of 70° to 90° can be formed.

As for the method for filling the trenches with an element isolation insulating film, an insulating film material can be deposited according to a conventionally known method such as a sputtering method or a CVD method, so as to have a film thickness that completely fills in the trenches, and the portions of the insulating film other than those in the trenches can be removed according to a known technology such as a CMP method. This insulating film material is not particularly limited, but rather, a silicon oxide film, a silicon nitride film, a silicon nitride oxide film or the like can be used.

Here, according to the present invention, a step of forming a well may be included after the step (1) and before the step (2).

In the step (2), a silicon oxide film that is conventionally utilized in a flash memory can be used as a tunnel insulating film.

The charge-storable film may be a film that includes at least one of a polysilicon film, a silicon nitride film ($Si_3N_4$ film) and an alumina film ($Al_2O_3$ film), and may be a single-layer film or a layered film having two or more layers.

In the step (3), the interlayer insulating film may be a film that includes at least one of a silicon oxide film and a silicon nitride film, and may be a single-layer film or a layered film having two or more layers. Among these, the silicon oxide film is preferable.

In the step (4), polysilicon that is conventionally utilized in a flash memory can be used for the control gates.

A flash memory that is fabricated in the steps (1) to (4) has a layered structure of the tunnel insulating film/polysilicon film (floating gate)/interlayer insulating film/polysilicon (control gate), or a layered structure the tunnel insulating film/$Si_3N_4$ film or $Al_2O_3$ film (floating gate)/interlayer insulating film/polysilicon (control gate).

In the step (5), upon etching the element isolation insulating films, either of dry etching and wet etching is possible by using an etchant that can etch the element isolation insulating films, though dry etching is preferable.

Here, in the steps (1) to (5), conventionally known methods can be generally used, and the details thereof will be described below first and second embodiments.

In the step (6), the ionic species for isotropic plasma ion implantation may include at least one of phosphorous, arsenic and antimony, and from among these, arsenic is preferable. The conditions for this isotropic plasma ion implantation depend on a type of fabricated memory cells and, for example, an implantation energy of 1 KeV to 50 KeV, preferably 1 keV to 20 keV, more preferably 10 KeV, can be cited, and a dose amount of 1.0 E14 to 1.0 E16 dose/$cm^2$, preferably 5.0 E14 to 5.0 E15 dose/$cm^2$, more preferably 2.0 E15 dose/$cm^2$ can be cited. In this case, the resistance in the source formation regions can be lowered by carrying out ion implantation to a shallow depth of the substrate with high concentration impurities.

The isotropic plasma ion implantation is carried out according a method for isotropically implanting ions into an object by applying a pulse voltage as a bias to an object (semiconductor substrate in this case) that is placed in a plasma atmosphere within a vacuum container. This isotropic plasma ion implantation allows for the formation of an ion sheath around the object, due to the voltage, so that ions are uniformly implanted from the surrounding of the object. Therefore, ions are implanted in the active regions and the side faces and bottom faces of the trenches in the source formation regions of the semiconductor substrate in the respective approximately perpendicular directions; thus, diffusion layers having a uniform impurity concentration are formed in the active regions and the side faces and bottom faces of the trenches. As a result, the resistance of the source formation regions is uniformly reduced (for example, 5000Ω or less). Herein, the term, uniform in the impurity concentration, means that the difference in the impurity concentration between the bottom faces of the trenches or the active regions which have flat surfaces in the source formation regions and the side faces of the trenches is 30% or less, preferably 0.

According to the manufacturing method, a semiconductor memory device according to the present invention is manufactured so as to comprising: element isolation regions in which plural trenches formed in stripes in a semiconductor substrate are partially filled with an element isolation insulating film; a tunnel insulating film, a charge-storable film and an interlayer insulating film which are sequentially formed so as to partially cover active regions between the element isolation regions; and plural control gates formed on the interlayer insulating film in a direction orthogonal to a longitudinal direction of the trenches, wherein among source formation regions and drain formation regions alternately provided between the plural control gates, the source formation regions each composed of side faces and a bottom face of the trench and the active regions serve as source diffusion layers having a uniform impurity concentration.

This semiconductor memory device can be formed in the above-described manner where the difference in the impurity concentration between the bottom face of the trench or the active region and the side face of the trench is 30% or less, the ratio of the depth of the trench to the width at the top of the trench is 0.3 to 2, and the side face tapered angle with respect to the bottom face is 70° to 90°.

In the following, embodiments of the present invention will be described in detail with reference to the drawings. Here, the present invention is not limited to the embodiments.

First Embodiment

FIG. 1 is a plan view showing a memory cell portion of a semiconductor memory device according to a first embodiment of the present invention. FIGS. 2 to 16 are cross-sectional views sequentially showing first to fifteenth steps of a manufacturing method of the memory cell portion of the semiconductor memory device according to the first embodiment of the present invention, where (a) and (b) of each figure illustrate cross-sectional views taken along lines I-I and II-II of FIG. 1, respectively.

Figure 2A:
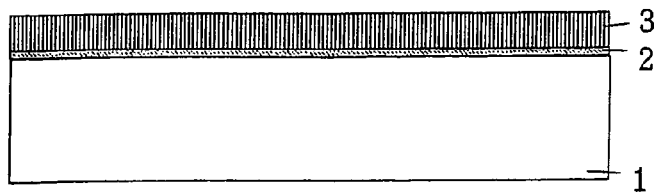
FIGS. 2 to 16 are cross-sectional views sequentially showing first to fifteenth steps of a manufacturing method of the memory cell portion of the semiconductor memory device according to a first embodiment of the present invention.
Figure 2B:
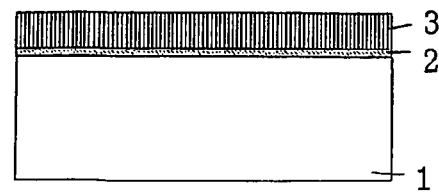
Figure 3A:
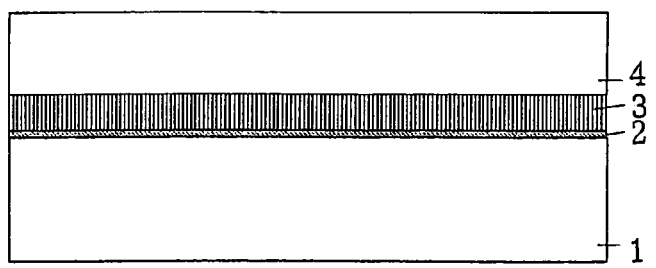
Figure 3B:
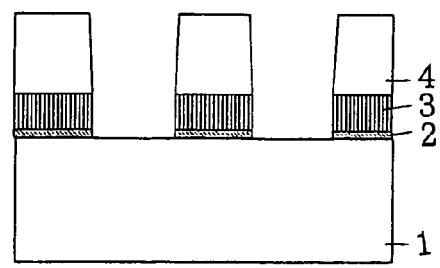

The manufacturing steps of the semiconductor memory device of the first embodiment will be described. First, as shown in FIG. 2, a thermally oxidized film 2 is formed on a surface of a P-type silicon substrate 1 so as to have a thickness of 140 angstroms, and a silicon nitride film 3 is deposited thereon so as to have a thickness of 1600 angstroms according to a known technology such as a sputtering method or a CVD method. Next, as shown in FIG. 3, a photoresist film 4 is formed on the silicon nitride film 3 in a known manner and patterned into a stripe form according to a photolithographic method, and the silicon nitride film 3 and the thermally oxidized film 2 are removed by means of dry etching, using the photoresist film 4 as a mask.

Figure 4A:
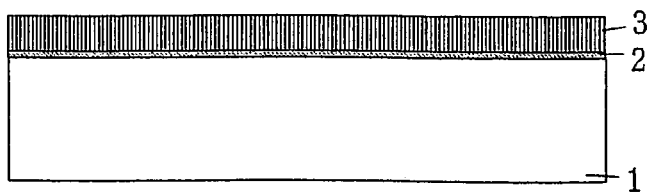
Figure 4B:
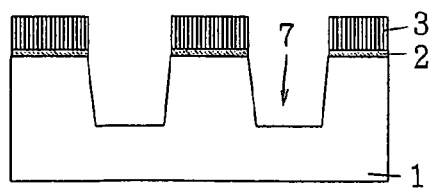
Figure 5A:
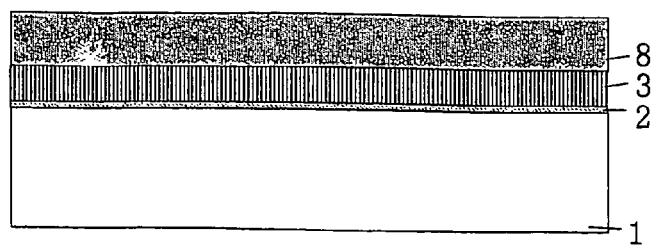
Figure 5B:
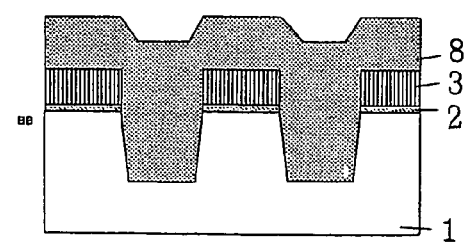
Figure 6A:
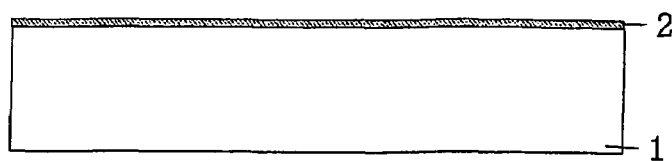
Figure 6B:
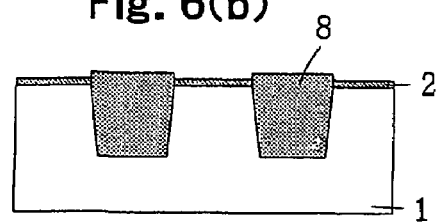

Next, as shown in FIG. 4, after the photoresist film 4 is removed, plural trenches 7 are formed in stripes in the silicon substrate 1 by means of dry etching, using the silicon nitride film 3 as a mask. Next, as shown in FIG. 5, an element isolation insulating film 8 is deposited on the entire surface of the silicon substrate 1 so as to have at least a film thickness which completely fills in the trenches 7 according to a sputtering method, a CVD method or the like. Next, as shown in FIG. 6, the silicon nitride film 3 is used as a stopper film to flatten the element isolation insulating film 8 according to a CMP (Chemical Mechanical Polishing) method and, also, the silicon nitride film 3 is removed. As a result, element isolation regions 6 and active regions 5 are formed, alternately (see FIG. 1).

Figure 7A:
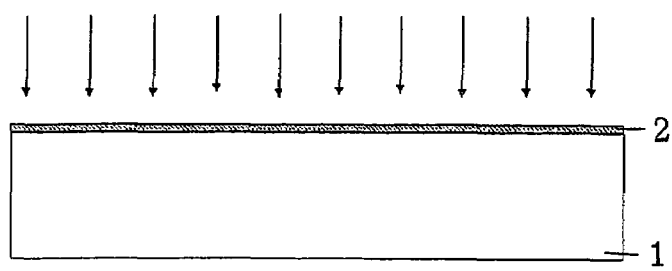
Figure 7B:
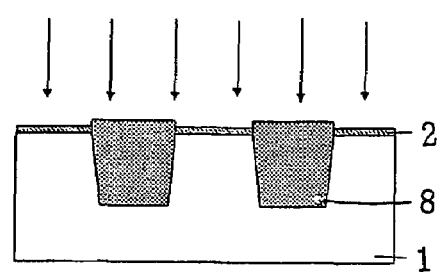

Next, as shown in FIG. 7, in order to form a well for the memory cell portion, a photoresist film (not shown) is formed on the thermally oxidized film 2 so as to be patterned into a predetermined form. Thereafter, ions of phosphorous ($^{31}P^+$) are implanted with an implantation energy of 3 MeV and a dose amount of 5.0 E12 dose/cm$^2$, so that an N well region (not shown) of which a depth is approximately 0.8 μm to 1.5 μm is formed within the P-type silicon substrate 1. The ion implantation in this case is anisotropic ion implantation by means of an ion beam, and plural arrow marks in FIG. 7 indicate ion implantation in the direction perpendicular to the surface of the substrate.

Figure 8A:
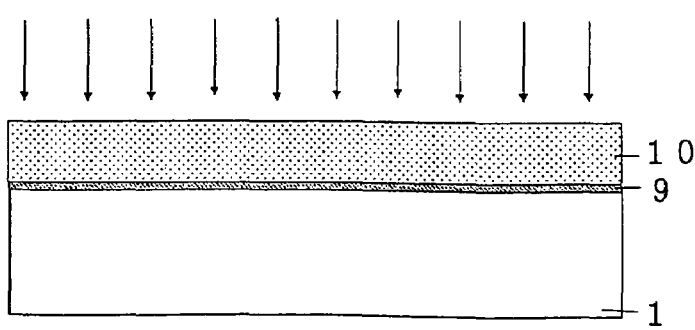
Figure 8B:
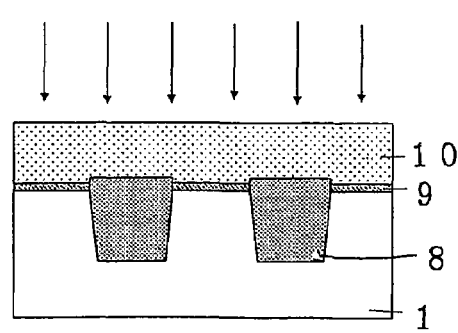

Next, after the photoresist film and the thermally oxidized film 2 are removed, as shown in FIG. 8, a new thermally oxidized film 9 is formed on the surface of the P-type silicon substrate 1 so as to have a thickness of 270 angstroms, and a photoresist film 10 is formed thereon and is patterned into a predetermined form. Thereafter, ion implantation of phosphorous ($^{31}P^+$) is carried out with an implantation energy of 300 MeV and a dose amount of 2.0 E12 dose/cm$^2$, followed by continuous second ion implantation with 800 KeV and 5.0 E12 dose/cm$^2$ to form an N well region in the peripheral circuit portion within the P-type silicon substrate 1. The ion implantation in this case also is anisotropic ion implantation by means of an ion beam, and plural arrow marks in FIG. 8 indicate ion implantation in the direction perpendicular to the surface of the substrate.

Figure 9A:
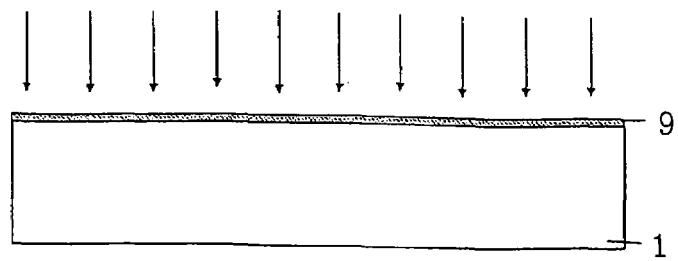
Figure 9B:
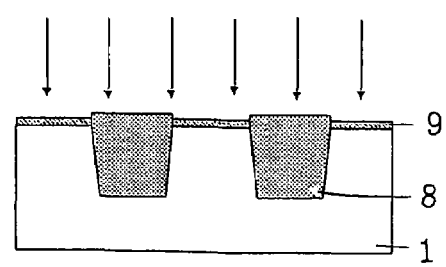

Next, as shown in FIG. 9, after the photoresist film 10 is removed, a new photoresist film (not shown) is formed so as to be patterned into a predetermined form. Thereafter, ion implantation of boron ($^{11}B^+$) is carried out with 300 KeV and 4.0 E12 dose/cm$^2$, followed by continuous second ion implantation with 100 KeV and 5.0 E12 dose/cm$^2$ to form a P well region (not shown). Next, after the photoresist film is removed, a new photoresist is formed so as to be patterned into a predetermined form (not shown), and boron ($^{11}B^+$) is implanted with an implantation energy of 50 KeV and a dose amount of 2.0 E13 dose/cm$^2$ to form channel regions. The ion implantation in this case also is anisotropic ion implantation by means of an ion beam, and plural arrow marks in FIG. 9 indicate ion implantation in the direction perpendicular to the surface of the substrate.

Figure 10A:
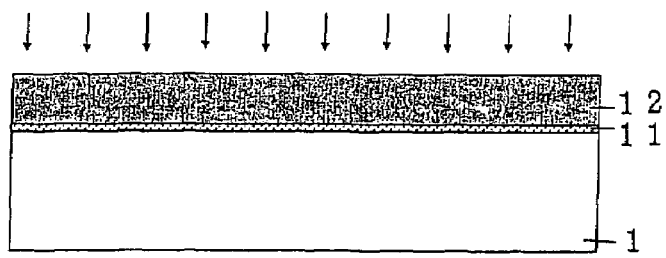
Figure 10B:
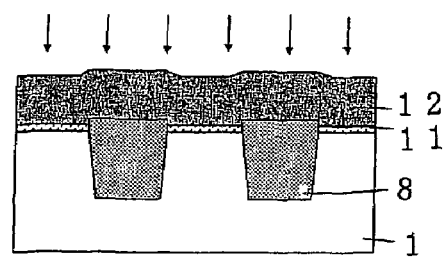

Subsequently, after the photoresist is removed, as shown in FIG. 10, the thermally oxidized film 9 is removed. Thereafter, a tunnel insulating film 11 is formed on the entire surface of the P-type silicon substrate 1 so as to have a thickness of 70 angstroms, and a first polycrystal silicon film 12 (hereinafter, described as FG electrodes in some cases) which becomes floating gates is formed thereon so as to have a thickness of 1500 angstroms, and ion implantation of phosphorous ($^{31}P^+$) is carried out with an implantation energy of 30 KeV and a dose amount of 6.0 E14 dose/cm$^2$ on the entire surface of the first polycrystal silicon film 12.

The ion implantation in this case also is anisotropic ion implantation by means of an ion beam, and plural arrow marks in FIG. 10 indicate ion implantation in the direction perpendicular to the surface of the substrate.

Figure 11A:
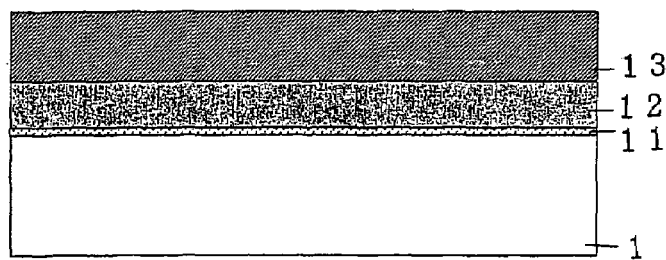
Figure 11B:
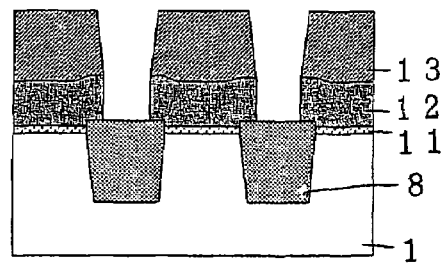
Figure 12A:
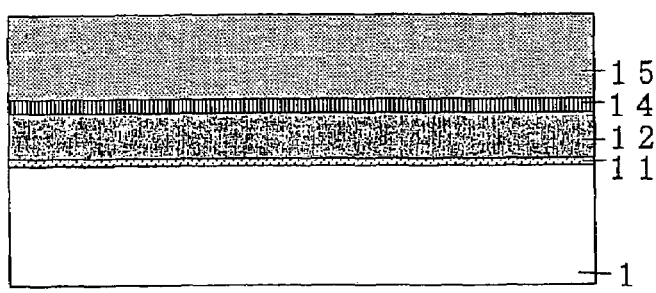
Figure 12B:
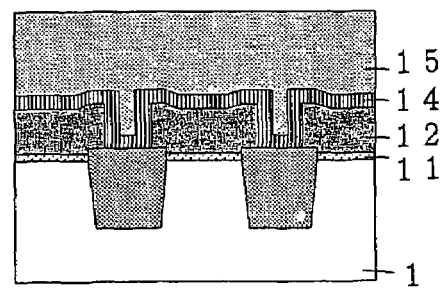
Figure 13A:
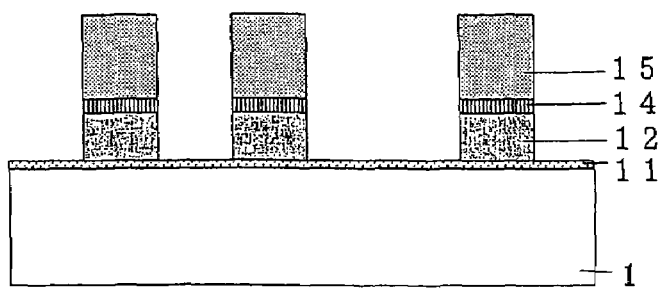
Figure 13B:
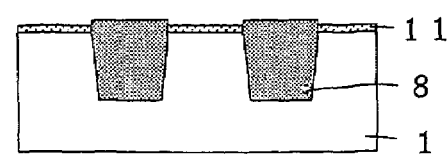

Next, as shown in FIG. 11, a photoresist film 13 is formed on the first polycrystal silicon film 12 so as to be patterned into a predetermined form. Thereafter, dry etching is carried out using the photoresist film 13 as a mask, and the FG electrodes 12 are patterned into a predetermined form. Next, as shown in FIG. 12, after the photoresist film 13 is removed, a layered insulating film (interlayer insulating film) 14 having an ONO structure, where a thermally oxidized film (SiO$_2$) is deposited so as to have a film thickness of 40 angstroms, a silicon nitride film is deposited so as to have a film thickness of 60 angstroms, and an insulating oxide film (SiO$_2$) is deposited so as to have a film thickness of 70 angstroms, is formed so as to cover the FG electrodes 12, and a second polycrystal silicon film 15 (hereinafter, described as CG electrodes in some cases) which becomes control gates is formed thereon so as to have a thickness of 3000 angstroms. Next, a photoresist film (not shown) is formed on the second polycrystal silicon film 15 so as to be patterned into a predetermined form. Thereafter, as shown in FIG. 13, the second polycrystal silicon film 15, the layered insulating film 14 and the FG electrodes 12 are patterned by means of dry etching, and the photoresist film is removed.

Figure 14A:
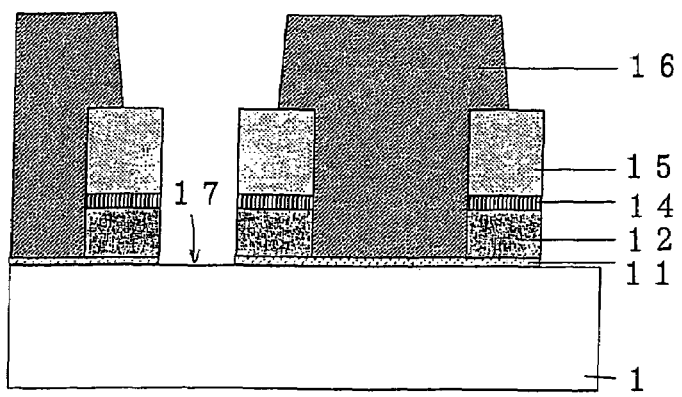
Figure 14B:
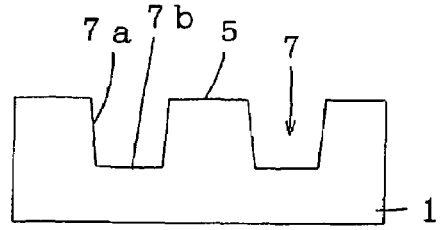

Next, as shown in FIG. 14, a photoresist film 16 is formed on the silicon substrate 1 and is patterned so as to have openings in source formation regions 17 between the CG electrodes 15 and, then, the element isolation insulating film 8 in the source formation regions 17 is removed by means of dry etching so as to expose the active regions 5 and side faces 7a and bottom faces 7b of the trenches 7, which are the surfaces of the silicon substrate 1 in the source formation regions 17. Thereafter, the tunnel insulating film 11 on the silicon substrate 1 in the source formation regions 17 is removed by means of dry etching, and the photoresist film 16 is removed.

Figure 15A:
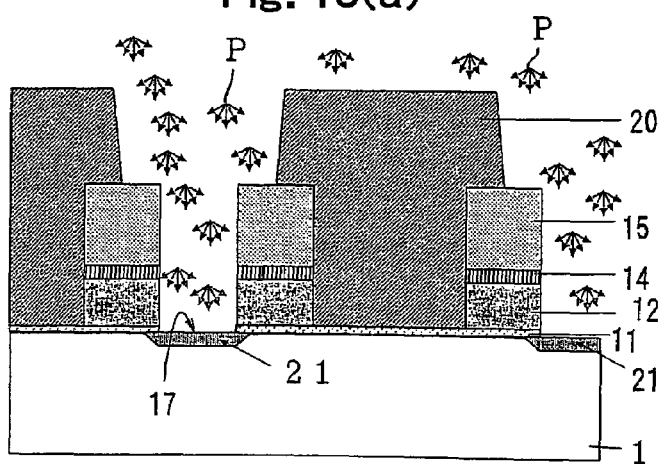
Figure 15B:
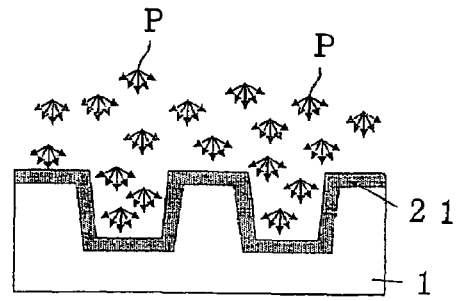

Next, as shown in FIG. 15, a photoresist film 20 is formed and is patterned so as to have openings, again, in the source formation regions 17 and, then, isotropic plasma ion implantation is carried out, that is, ions are implanted in multiple directions by means of isotropic plasma ion implantation. At this time, arsenic ($^{75}As^+$), phosphorous ($^{31}P^+$) or antimony ($^{121}Sb^+$) is used as the implanted ionic species which are isotropically implanted with an implantation energy of 1 keV or more and a dose amount of 1.0 E15 dose/cm$^2$ or more, so that ions are implanted in the active regions and the side faces and bottom faces of the trenches in the source formation regions 17 in the respective approximately perpendicular directions, thus forming source diffusion layers 21 having a uniform impurity concentration in the active regions and the side faces and bottom faces of the trenches. Here, in FIG. 15, plural arrows P in radiating form indicate isotropic plasma ion implantation.

Figure 16A:
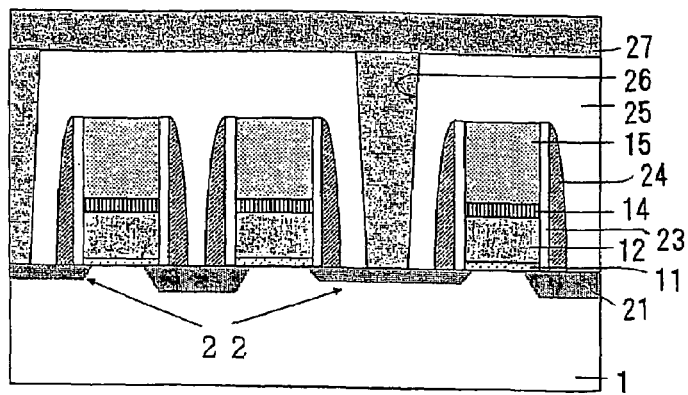
Figure 16B:
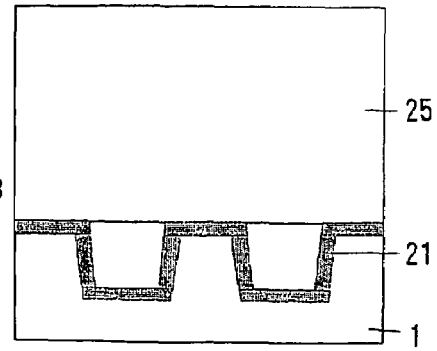

Next, with reference to FIG. 16, the photoresist film 20 is patterned so as to have openings in the drain formation regions between the CG electrodes 15, and the tunnel insulating film 11 on the silicon substrate in the drain formation regions is removed by means of dry etching. Thereafter, ion implantation of arsenic ($^{75}As^+$) is carried out with an implantation energy of 15 keV and a dose amount of 2.0 E15 dose/cm$^2$, so as to form the drain diffusion layers 22. In this case, anisotropic ion implantation in the direction perpendicular to the plane of the silicon substrate 1 is carried out as the ion implantation, and ions are also implanted in the source formation regions 17.

Thereafter, the photoresist film 20 is removed, a thermally oxidized film 23 is formed on the entire surface of the silicon substrate 1, an HTO film is deposited so as to have a thickness of 1300 angstroms, etch back is carried out on the entire surface by means of dry etching, and sidewall spacers 24 are formed of the HTO film on the sidewalls of the CG electrodes. Next, an annealing process is carried out on the source and drain regions, and an interlayer insulating film 25 (BPSG film) is deposited on the entire surface of the silicon substrate 1 according to a CVD method. Subsequently, a photoresist film (not shown) is formed on the interlayer insulating film 25 so as to be patterned into a predetermined form and, then, the interlayer insulating film 25 in the portions that correspond to the drain regions is etched to form contact holes 26. Thereafter, the photoresist film is removed, and a new photoresist film is formed so as to be patterned into a predetermined form, and wire material such as Al or Ti is deposited onto the interlayer insulating film 25 according to a sputtering method so as to have a film thickness that is greater than the depth of the contact holes 26. The thickness of the wire material is reduced to a film thickness of about 1.0 µm according to a CMP method to form MR wires 27 on the interlayer insulating film 25, and contact wires are formed so as to fill in the contact holes 26; thus, a nonvolatile semiconductor memory device is fabricated.

Second Embodiment

Next, a second embodiment of the present invention will be described with reference to FIGS. 17 to 23. In the second embodiment, the steps in FIGS. 1 to 9 (up to the eight step of forming a P well region) that are described in the first embodiment are the same; therefore, descriptions thereof are omitted. FIGS. 17 to 23 are cross-sectional views sequentially showing ninth to fifteenth steps of the manufacturing method of a memory cell portion of a semiconductor memory device according to the second embodiment of the present invention, and (a) and (b) of each figure are cross-sectional views taken along lines I-I and II-II of FIG. 1, respectively. In the second embodiment, the same symbols are attached to elements that are the same as those in the first embodiment.

According to the second embodiment, after formation of a P well region, a photoresist film is patterned into a predetermined form and, thereafter, anisotropic ion implantation of boron ($^{11}B^+$) is carried out with an implantation energy of 50 keV and a dose amount of 2.0 E13 dose/cm$^2$ to form channel regions. Subsequently, the photoresist film is removed and the thermally oxidized film is removed. Thereafter, as shown in FIG. 17, a tunnel insulating film 11 is formed on the entire surface of the P-type silicon substrate 1 so as to have a thickness of 70 angstroms, and a charge storing layer 42 is formed of an $Si_3N_4$ film thereon so as to have a thickness of 60 angstroms. Herein, an $Al_2O_3$ film may be used instead of an $Si_3N_4$ film as the charge storing layer. Subsequently, a silicon oxide film (interlayer insulating film) 43 is formed on the charge storing layer 42 so as to have a thickness of 90 angstroms.

Next, as shown in FIG. 18, a photoresist film 44 is formed on the oxide film 43 and is patterned so as to have openings above the element isolation films 8. Then, the silicon oxide film 43 and the charge storing layer ($Si_3N_4$ film) 42 are patterned by means of dry etching. Next, as shown in FIG. 19, after the photoresist film 44 is removed, a second polycrystal silicon film 15 (hereinafter, described as CG electrodes 15 in some cases) which becomes control electrodes is formed on the entire surface of the silicon substrate 1, so as to cover the charge storing layer 42 and so as to have a thickness of 3000 angstroms. Next, a photoresist film (not shown) is formed on the second polycrystal silicon film 15 so as to be patterned into a predetermined form. Thereafter, as shown in FIG. 20, the CG electrodes 15, the silicon oxide film 43 and the charge storing layer 42 are patterned by means of dry etching, after which the photoresist film is removed.

Figure 21A:
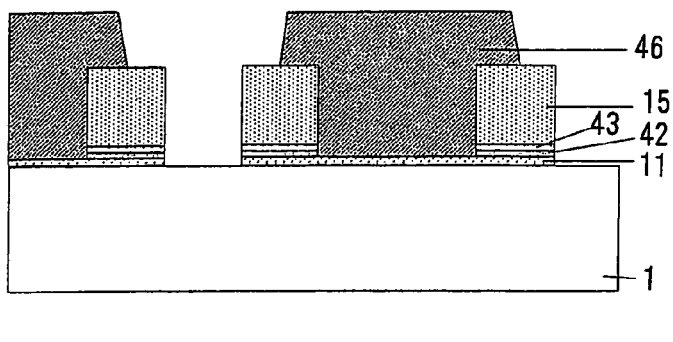
Figure 21B:
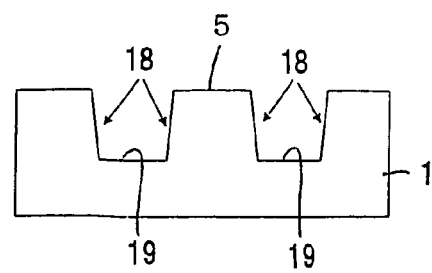

Next, as shown in FIG. 21, a photoresist film 46 is formed on the entire surface of the silicon substrate 1 and is patterned so as to have openings in the source formation regions 17 between the CG electrodes 15. Then, the element isolation insulating film 8 in the source formation regions 17 is removed by means of dry etching to expose the active regions 5 and side faces 18 and bottom faces 19 of the trenches, which are the surfaces of the silicon substrate 1 in the source formation regions 17. Thereafter, the tunnel insulating film 11 on the silicon substrate 1 in the source formation regions 17 is removed by means of dry etching, and the photoresist film 46 is removed.

Figure 22A:
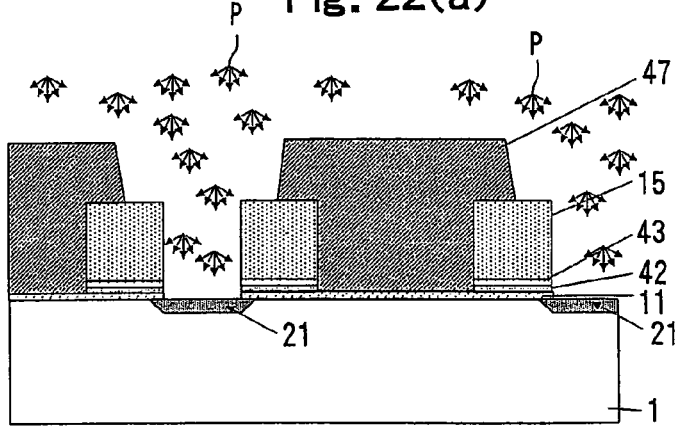
Figure 22B:
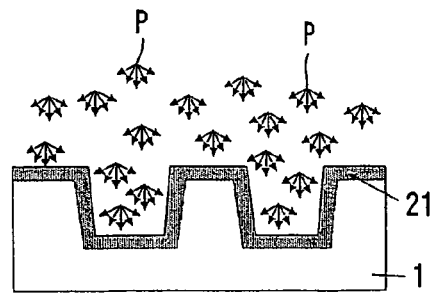

Next, as shown in FIG. 22, the photoresist film 47 is formed again and openings are formed in the source formation regions 17, through which ion implantation in multiple directions is carried out by means of isotropic plasma ion implantation. At this time, arsenic ($^{75}As^+$), phosphorous ($^{31}P^+$) or antimony ($^{121}Sb^+$) is used as implantation species, and isotropic ion implantation is carried out with an implantation energy of 1 keV or more and a dose amount of 1.0 E15/cm$^2$ or more. As a result, ions are implanted into the active regions and the side faces and bottom faces of the trenches in the source formation regions 17 in the respective approximately perpendicular directions, so that the source diffusion layers 21 having a uniform impurity concentration are formed in the active regions and the side faces and bottom faces of the trenches. In FIG. 22, plural arrow marks P in radiating form indicate isotropic plasma ion implantation.

Figure 23A:
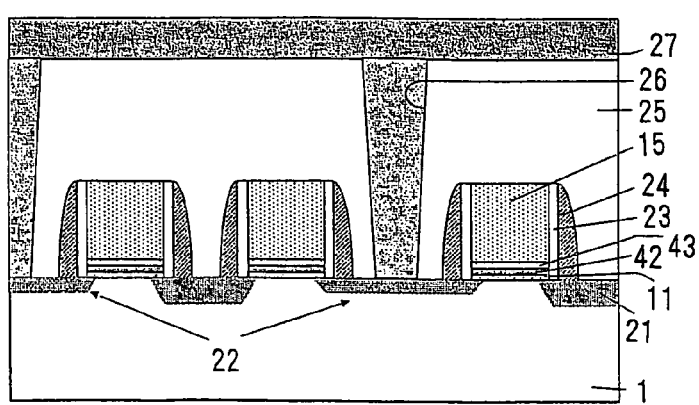
Figure 23B:
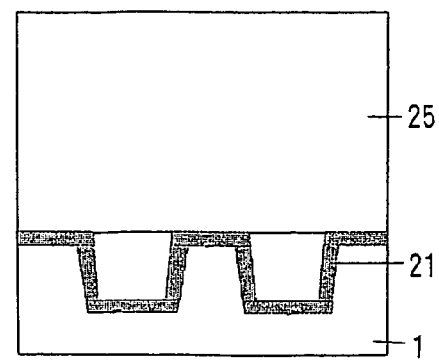
Figure 24B:
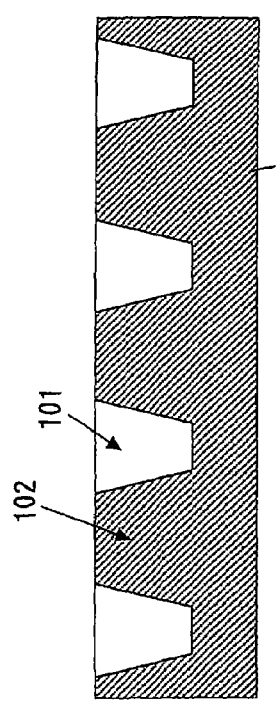
Figure 24C:
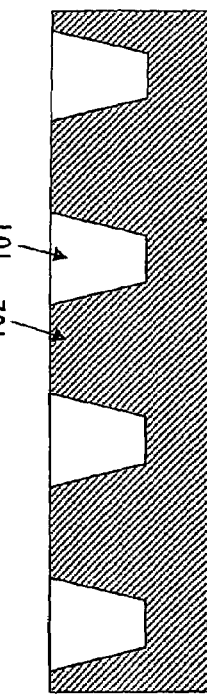
Figure 24D:
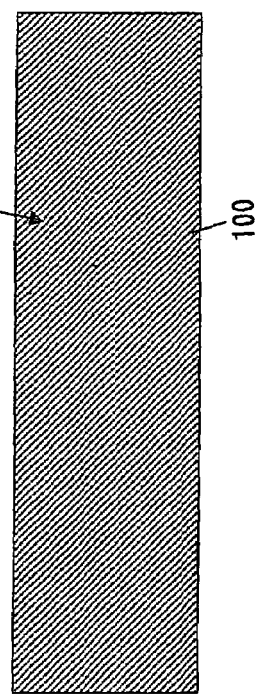
Figure 24A:
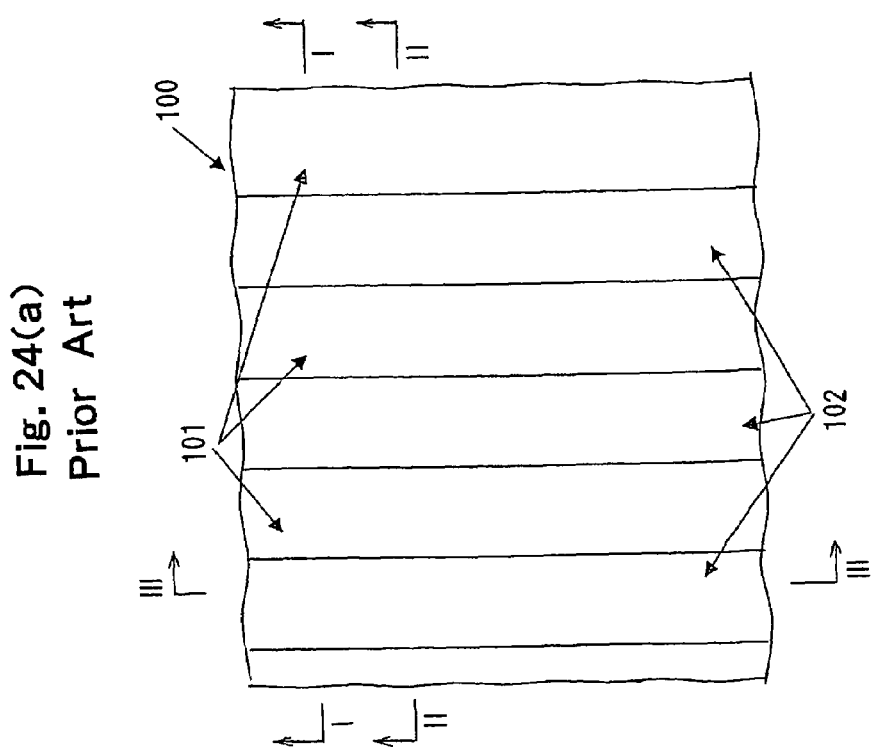
Figure 25D:
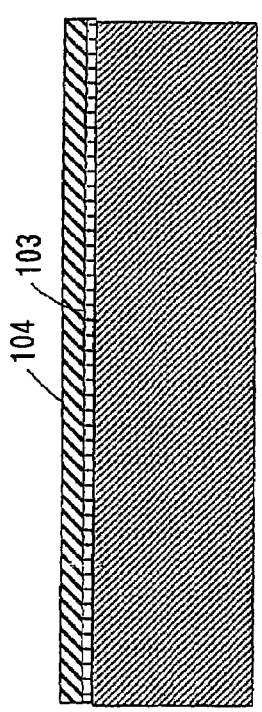
Figure 25C:
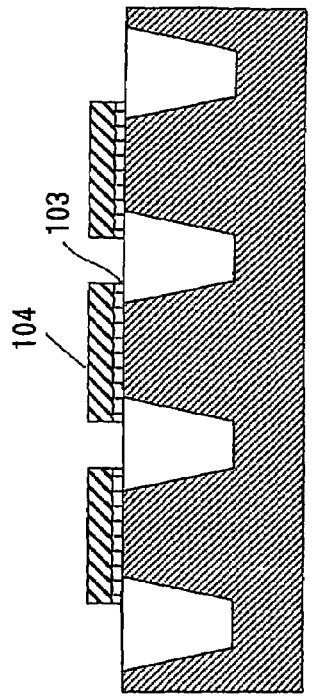
Figure 25B:
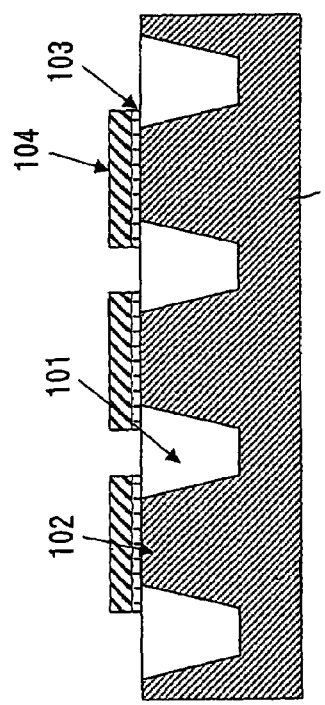
Figure 25A:
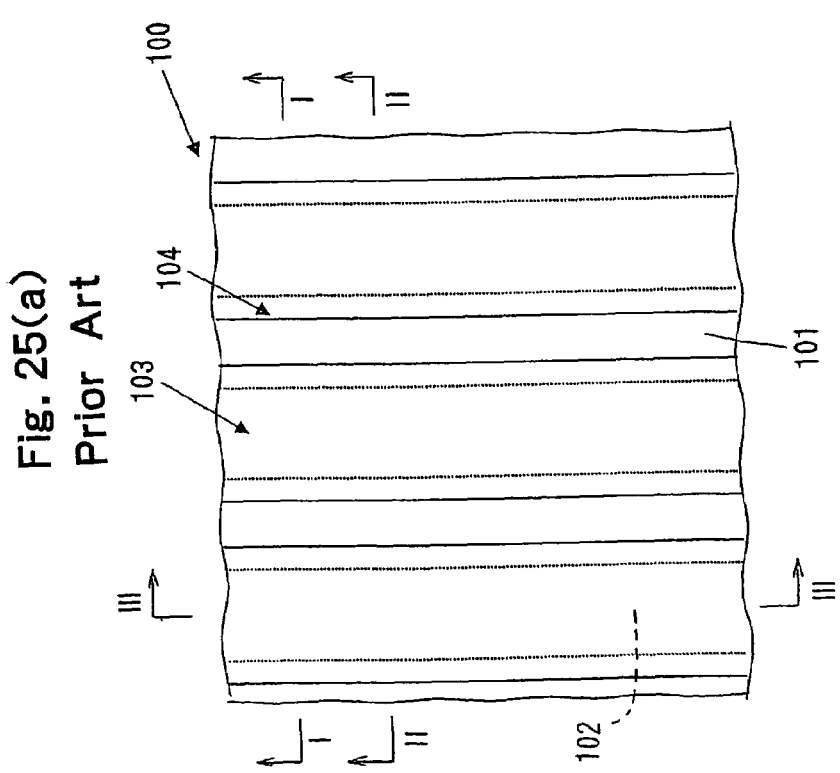
Figure 26B:
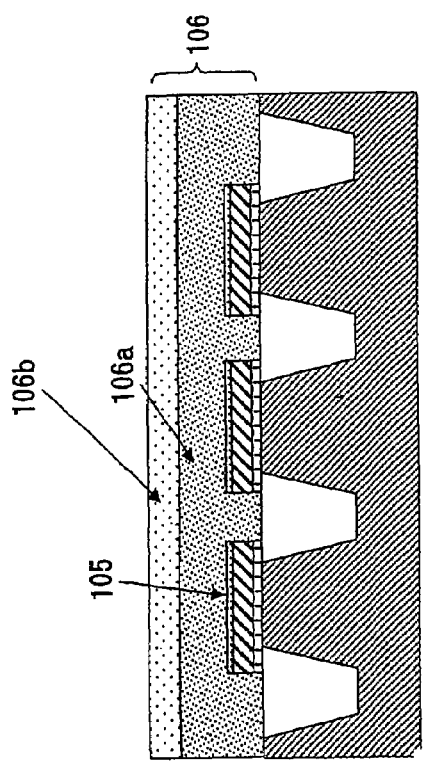
Figure 26C:
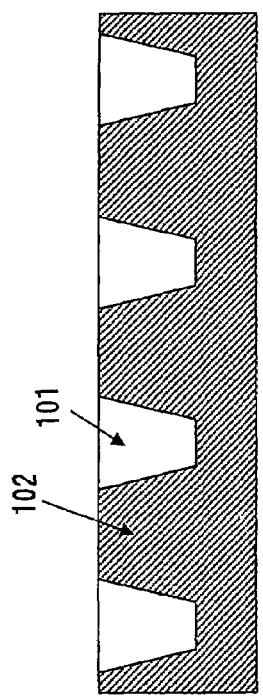
Figure 26D:
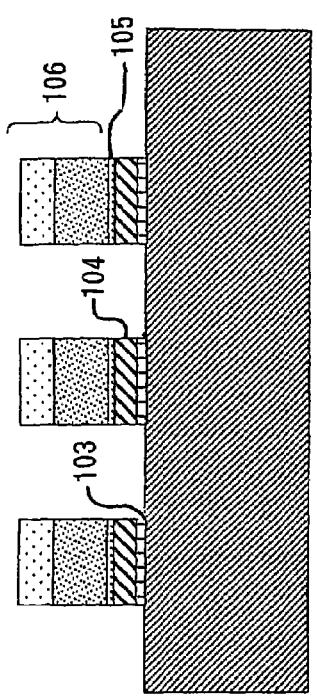
Figure 26A:
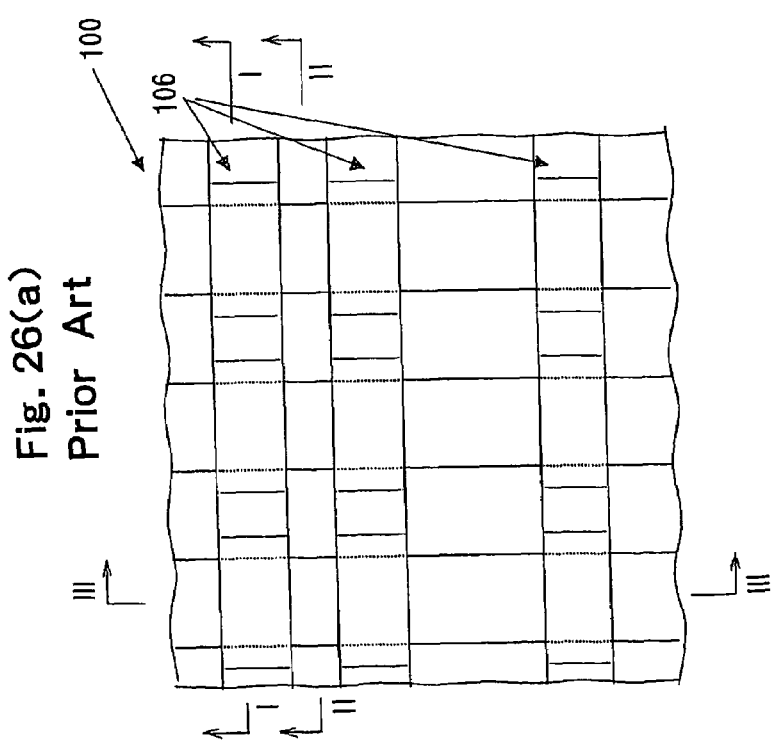
Figure 28B:
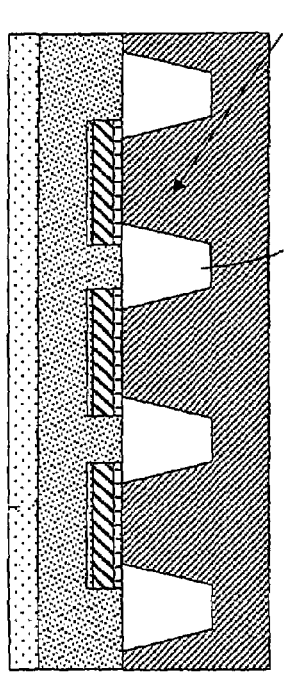
Figure 28C:
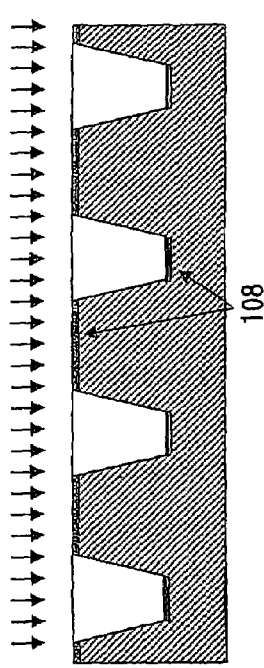
Figure 28D:
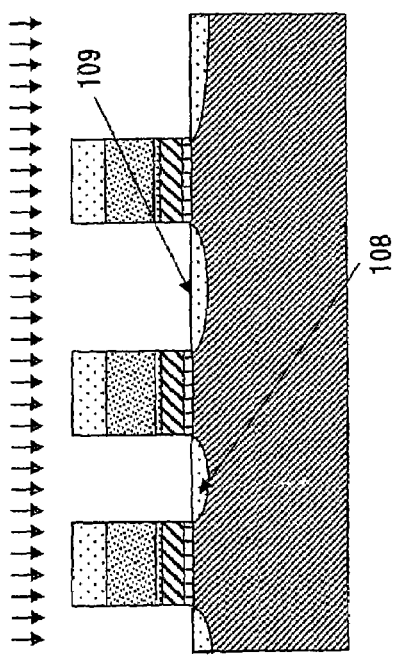
Figure 28A:
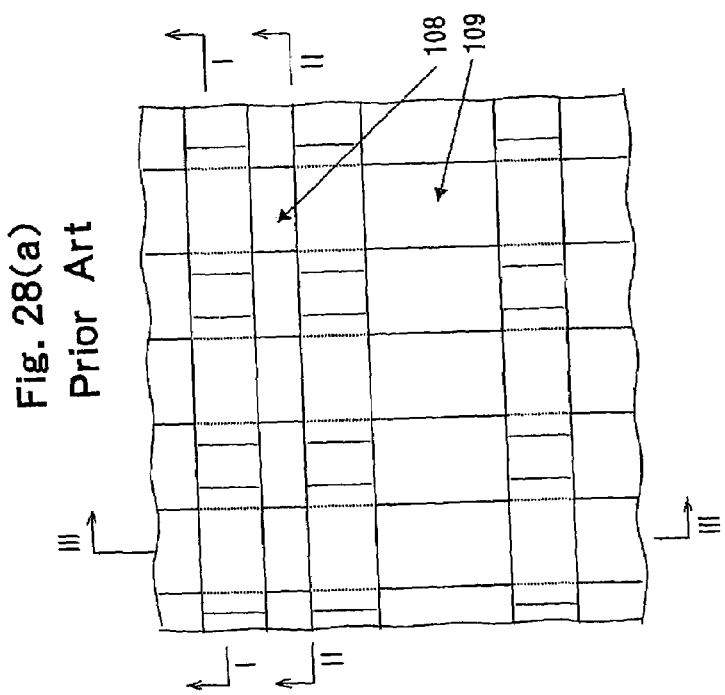
Figure 29B:
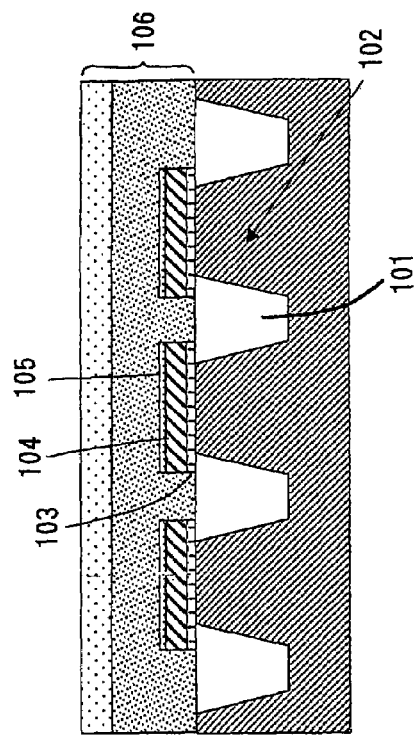
Figure 29C:
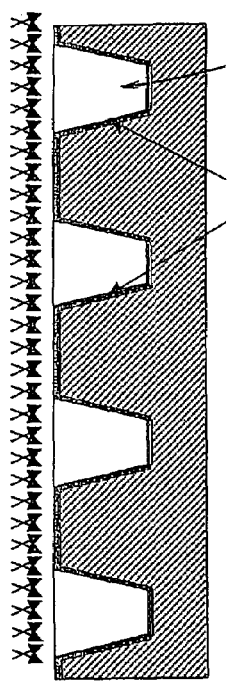
Figure 29D:
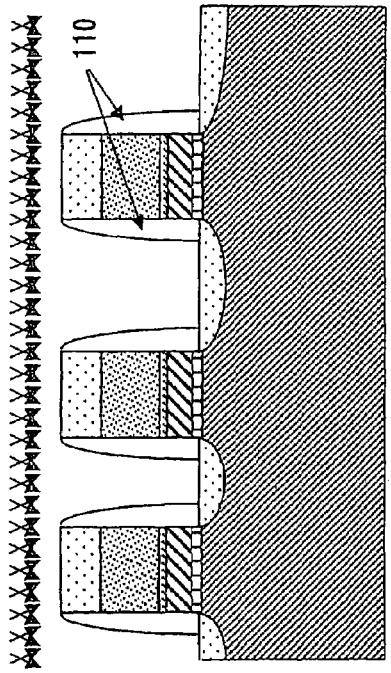
Figure 29A:
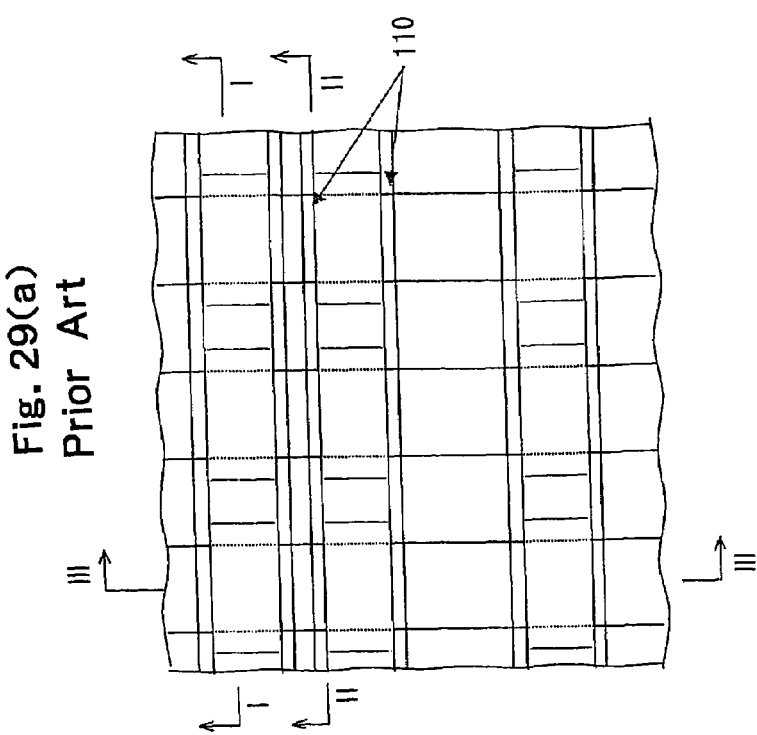

Next, with reference to FIG. 23, after the photoresist film 47 is removed, a new photoresist (not shown) is formed. The photoresist film is patterned so as to have openings in the drain formation regions between the CG electrodes 15, and the tunnel insulating film 11 on the silicon substrate in the drain formation regions is removed by means of dry etching, and ion implantation of arsenic ($^{75}As^+$) is carried out with an implantation energy of 15 KeV and a dose amount of 2.0 E15 dose/cm$^2$ to form drain diffusion layers 22. The ion implantation in this case is anisotropic ion implantation in the direction perpendicular to the plane of the silicon substrate 1, and ions are implanted in the source formation regions 17.

Thereafter, the photoresist film 47 is removed, a thermally oxidized film 23 is formed on the entire surface of the silicon substrate 1, an HTO film is deposited so as to have a thickness of 1300 angstroms, etch-back is carried out on the entire surface by means of dry etching; thus, sidewall spacers 24 are formed of the HTO film on the sidewalls of the CG electrodes. Next, an annealing process is carried out on the source and drain regions, and an interlayer insulating film 25 (BPSG film) is deposited on the entire surface of the silicon substrate 1 according to a CVD method. Subsequently, a photoresist film (not shown) is formed on the interlayer insulating film 25 so as to be patterned into a predetermined form, and contact holes 26 are formed by etching the interlayer insulating film 25 in the portions that correspond to the drain regions. Thereafter, the photoresist film is removed, and a new photoresist film is formed so as to be patterned into a predetermined form, and a wire material such as Al or Ti is deposited on interlayer insulating film 25 according to a sputtering method so as to have a film thickness that is greater than the depth of contact holes 26. The thickness of the wire material is reduced according to a CMP method so as to have a film thickness of about 0.6 µm, and MR wires 27 are formed on the interlayer insulating film 25 and contact wires are formed so as to fill in the contact holes 26; thus, a nonvolatile semiconductor memory device is fabricated.

What is claimed is:

1. A manufacturing method of a semiconductor memory device comprising the steps of:
    forming plural trenches in stripes in a semiconductor substrate and filling each of the trenches with an element isolation insulating film to form element isolation regions;
    sequentially forming a tunnel insulating film and a charge-storable film so as to cover active regions between the element isolation regions;
    forming an interlayer insulating film on the charge-storable film;
    forming plural control gates on the interlayer insulating film in a direction orthogonal to a longitudinal direction of the trenches;
    among source formation regions and drain formation regions alternately provided between the plural control gates, etching the element isolation insulating film in the source formation regions, using as a mask a resist film having openings in the source formation regions, to expose surfaces of the trenches; and
    carrying out isotropic plasma ion implantation on the source formation regions to form source diffusion layers in the surfaces of the trenches and in the active regions.

2. The manufacturing method according to claim 1, wherein the charge-storable film includes at least one of a polysilicon film, a silicon nitride film and an alumina film.

3. The manufacturing method according to claim 1, wherein the interlayer insulating film includes at least one of a silicon oxide film and a silicon nitride film.

4. The manufacturing method according to claim 1, wherein ionic species for the isotropic plasma ion implantation include at least one of phosphorous, arsenic and antimony.

5. The manufacturing method according to claim 1, wherein the isotropic plasma ion implantation is carried out at an implantation energy of 1 KeV to 50 KeV and a dose amount of 1.0 E 14 to 1.0 E16 dose/cm$^2$.

6. The manufacturing method according to claim 1, wherein each of the trenches is formed to have a ratio of the depth of the trench to the width at the top of the trench of 0.3 to 2.

7. The manufacturing method according to claim 1, wherein each of the trenches is formed to have side faces tapered with respect to a bottom face at an angle of 70° to 90°.

* * * * *